United States Patent [19]

Moskowitz

[11] Patent Number: 4,684,688

[45] Date of Patent: Aug. 4, 1987

[54] UV STABILIZER FOR POLYACETYLENIC RECORDING MEDIA

[75] Inventor: Mark L. Moskowitz, Wayne, N.J.

[73] Assignee: GAF Corporation, Wayne, N.J.

[21] Appl. No.: 900,120

[22] Filed: Aug. 25, 1986

[51] Int. Cl.$^4$ .......................... G03C 1/00; C08K 5/13
[52] U.S. Cl. .................... 524/336; 430/512; 430/536; 524/337; 524/338
[58] Field of Search ............... 430/18, 428, 429, 512, 430/931, 270, 273, 536; 524/336, 337, 338; 526/285; 525/59, 60

[56] References Cited

U.S. PATENT DOCUMENTS

| | | | |
|---|---|---|---|
| 2,568,894 | 9/1951 | Mackey | 524/337 |
| 2,773,778 | 12/1956 | Hoch et al. | 524/337 |
| 2,976,259 | 3/1961 | Hardy et al. | 524/338 |
| 3,215,530 | 11/1965 | Riebel et al. | 524/336 |
| 3,854,950 | 12/1974 | Held | 430/18 |
| 3,871,901 | 4/1975 | Carlsson et al. | 524/336 |
| 4,029,849 | 6/1977 | Abel | 430/322 |
| 4,200,747 | 9/1980 | Preziosi et al. | 526/285 |
| 4,267,262 | 5/1981 | Karino et al. | 430/536 |
| 4,581,267 | 4/1986 | Miller | 430/18 |

Primary Examiner—Veronica P. Hoke
Attorney, Agent, or Firm—Marilyn J. Maue; Joshua J. Ward

[57] ABSTRACT

A light stabilizer for recording media subjected to exposure with radiant energy which comprises between about 10 and about 40 parts by weight of a vinyl ether/maleic acid ester copolymer and one part by weight of a hydroxylated benzophenone dissolved in an inert solvent to provide a clear solution and the process of coating said exposed recording media with said composition to a thickness of from about 5 to about 30 micrometers.

8 Claims, 1 Drawing Figure

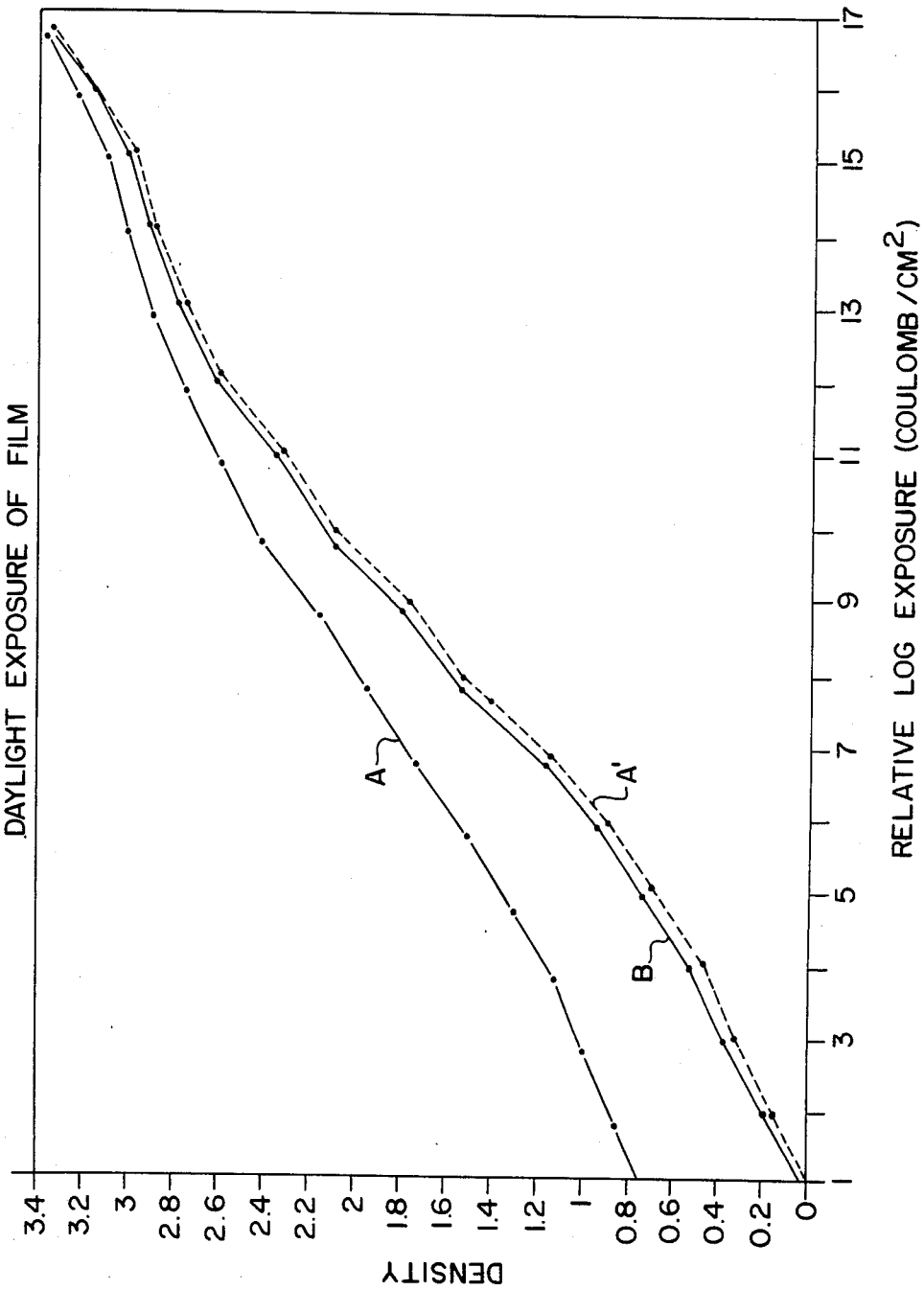

UV STABILIZER FOR POLYACETYLENIC RECORDING MEDIA

DISCUSSION OF PRIOR ART

Several types of polyacetylenic recording media have been developed which upon exposure to a pattern transmitted by radiant energy record information in a high degree of resolution and clarity. However, exposure of these films to UV light over extended periods has caused continued development of background density such that a high degree of resolution and clarity is gradually diminished.

Accordingly it is an object of the present invention to overcome the above deficiency by a convenient commercially feasible process with a relatively inexpensive composition.

Another object is to decrease inadvertant background exposure of said exposed films and to inhibit further film development upon exposure to ultra-violet light.

Another object of the present invention is to provide a novel composition for stabilizing exposed recording media.

These and other objects of the invention will become apparent from the following description and disclosure.

THE INVENTION

According to this invention there is provided a composition comprising one part by weight of a hydroxylated benzophenone having the formula

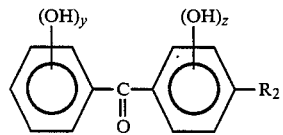

wherein y and z each have a value of 0–2 and the sum of y+z is at least 1 and $R_2$ is hydrogen, $C_1$ to $C_4$ alkyl or $C_1$ to $C_4$ alkoxy, and between about 10 and about 40 parts by weight, preferably between about 20 and about 30 parts by weight, of a vinyl ether/maleic acid ester copolymer having the structure

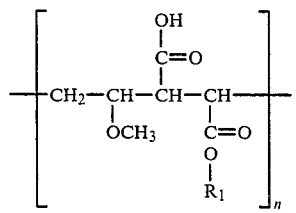

wherein n is an integer having a value of from 10 to 1000; and $R_1$ is alkyl having from 1 to 6 carbon atoms.

The above composition is employed in an inert solvent to provide a clear colorless solution. The number average molecular weight of the copolymer employed in this invention may vary between about 2,000 and about 200,000; however, a molecular weight of from about 10,000 to about 30,000 is recommended.

Suitable solvents for the benzophenone-copolymer composition include aliphatic alcohols having from 1 to 6 carbon atoms, ketones, esters, mineral spirits, etc. Of these, ethanol and propanol are preferred. Generally, the concentration of the composition in said solvent can vary between about 20% by weight and about 60% by weight; between 20-40% by weight being preferred.

The imaged recording media appertaining to the present invention includes commercially available multilayer base films carrying one or more imaging layers of polyacetylenic crystals. A typical film of this type comprises a microcrystalline polyacetylene in a non-solvating binder forming a layer of from about 0.25 to about 500 micrometers thickness which overlays a substrate from about 2 to about 10 mils thickness. The polyacetylenic compounds sensitive to imaging comprise conjugated diynes, preferably hydrocarbon or acid diynes containing from 20 to 30 carbon atoms and having the general formula $A-(CH_2)_n-C\equiv C-C\equiv C-(CH_2)_m-B$ wherein m and n are both independently integer of from 6 to 14 and A and B are independently methyl or carboxyl groups. Specific examples of such polyacetylenes include pentacosa-10,12-diynoic acid; 13,15-octacosadiyne and docosa-10,12-diyne-1, 22-dioic acid. It is to be understood however, that dispersions of other normally crystalline, color developing polyacetylenes having a conjugated structure can be employed alone or in admixture with the above diynes as the image receptive layer. Such compounds include the diynes of the above structure wherein the A and/or B moieties, in addition to lower alkyl or carboxyl, also can be hydroxy, amido, lower alkyl substituted amido, an aliphatic or aromatic carboxylate ester group having up to 10 carbon atoms, a mono- or divalent carboxylate metal salt group, halo, carbamyl, lower alkyl substituted carbamyl or tosyl, as well as the corresponding triyne and tetrayne products of the above polyacetylenes having from 20 to 60 carbon atoms and a conjugated structure. Examples of these compounds include 10,12-docosadiynediol, the ditoluene-p-sulfonate of 9,11-eicosadiynoic acid, the monoethyl ester of 10,12-docosadiynedioic acid, the sodium or potassium salt of 10,12-pentacosadiynoic acid, 10,12-docosadiyne chloride, 10,12-pentacosadiyne (m-tolyl-urethane), 10,12-pentacosadiyne {[butoxylcarbonyl)-methyl] urethane}, N-(dimethyl)-10,12-pentacosadiynamide, N,N'bis(α-methylbenzyl) 10,12-pentacosadiyndiamide.

Exemplary binder materials include natural and synthetic plastics, resins, waxes, colloids, gels and the like including gelatins, desirably photographic-grade gelatin, various polysaccharides including dextran, dextrin, hydrophilic cellulose ethers and esters, acetylated starches, natural and synthetic waxes including paraffin, beeswax, polyvinyl-lactams, polymers of acrylic and methacrylic esters and amides, hydrolyzed interpolymers of vinyl acetate and unsaturated addition polymerizable compounds such as maleic anhydride, acrylic and methylacrylic esters and styrene, vinyl acetate polymers and copolymers and their derivatives including completely and partially hydrolyzed products thereof, polyvinyl acetate, polyvinyl alcohol, polyethylene oxide polymers, polyvinylpyrrolidone, polyvinyl acetals including polyvinyl acetaldehyde acetal, polyvinyl butyraldehyde acetal, polyvinyl sodium-o-sulfobenzaldehyde acetal, polyvinyl formaldehyde acetal, and numerous other known photographic binder materials including a substantial number of aforelisted useful plastic and resinous substrate materials which are capable of being placed in the form of a dope, solution, dispersion, gel, or the like for incorporation therein of the photosensitive polyacetylenic composition and then capable of processing to a solid form containing dispersed crystals of the photosensitive crystalline polyacetylenic composition of matter. As is well known in the art in the preparation of smooth uniform continuous coatings of binder materials, there may be employed therewith small amounts of conventional coating aids as viscosity controlling agents, surface active agents, leveling agents, dispersing agents, and the like.

The preferred source of energy for exposure of the films of this invention is the electron beam. Generally the electrons, under high vacuum, between about $10^{-3}$ and about $10^{-9}$ torr, preferably between about $10^{-5}$ and about $10^{-8}$ torr, bombard the surface of the film thus transmitting an image thereon for development into an optical display. The techniques of electron beam recording are well known, thus further amplification is not required. However, for illustrative purposes, a typical electron beam recording operation suitable for the present invention may utilize an electron beam characterized by having a beam energy of from about 10 to 30 KeV, a current flow of from about $10^{-9}$ to $10^{-6}$ amps and adapted to scan a target area at a rate such that the dwell time is from about $10^{-3}$ to $10^{-8}$ seconds. Vacuum pressures in the film chamber commonly range from $10^{-3}$ to $10^{-5}$ torr.

According to this invention exposed recording films of the above type are coated to a thickness of from about 5 to about 30 micrometers with a solution of the above composition. Conventional coating methods such as spraying, dipping, or doctoring the recorded surface of the film are employed. The conditions of coating are also conventional and are preferably effected at ambient temperature and pressure. After coating, the film is air dried or placed in an oven at a temperature between about 30° and about 120° C. or at a temperature such that the coating composition remains clear and transparent. The coated film is thus rendered stable to UV light exposure for extended periods.

Having thus generally described the invention, reference is now had to FIG. 1 which summarizes comparative test data on coated and uncoated polyacetylenic type film. However, it is to be understood that these experiments plotted on the curve of the Figure should not be construed as limiting to the scope of the invention which is more broadly set forth above and in the appended claims.

In reference to FIG. 1, a coating solution of 25 grams of GAF Gantrez ES-425 (the methyl vinyl ether/monobutyl half ester of maleic acid copolymer) in 50% ethanol was thoroughly mixed at room temperature and ambient pressure with 1.25 grams of Cyanamid UV-24 (2,2'-dihydroxy-4-methoxy benzophenone) and 28.75 grams of ethanol to form a clear solution.

A first and second film sample, each having a recording layer of pentacosa-10,12-diynoic acid in a 4.0 micrometers thickness on a 4 mil polyester film base support, was imaged with an identical pattern by exposure to electron beam energy of about 15 KeV to provide recorded information thereon at image densities between 0.1 and 3.4.

The first of said imaged samples was hand coated on its exposed surface with the above solution and the solution was dried to provide a clear transparent coating layer of 10 micrometers thickness.

The second of said imaged samples was left uncoated and both coated and uncoated imaged films were exposed to daylight for a period of up to 27 days.

Shown in FIG. 1 is uncoated film, curve A and $A^1$. Curve $A^1$ (broken line) represents the uncoated film which has not been exposed to daylight. Curve A represents the uncoated film after 27 days exposure to daylight. As shown, the background density of the uncoated, daylight exposed film has increased 8 fold.

Curve B represents the film which has been coated as described above. Curve B, after 27 days exposure to the identical intensity of daylight shows barely any increase in background density development.

The significant improvement indicated in FIG. 1 is also achieved with the other compositions hereinabove specified.

What is claimed is:

1. A recording film coating composition comprising one part by weight of a hydroxylated benzophenone having the structure

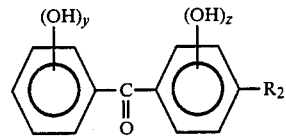

wherein y and z each have a value of 0-2 and the sum of $y+z$ is at least 1 and $R_2$ is hydrogen, $C_1$ to $C_4$ alkyl or $C_1$ to $C_4$ alkoxy, and between about 10 and about 40 parts by weight of a vinyl ether/maleic acid ester copolymer having the structure

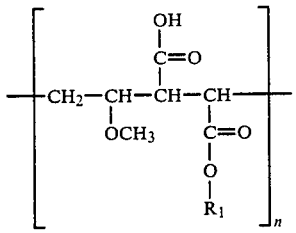

wherein n is an integer having a value of from 10 to 1,000; and $R_1$ is alkyl having from 1 to 6 carbon atoms, said composition dissolved in an inert solvent to provide a clear colorless solution.

2. The composition of claim 1 wherein $R_2$ is methyl; z is 0 and $R_1$ is butyl.

3. The composition of claim 1 wherein y and z each have a value of 1 and $R_2$ is methoxy.

4. The process which comprises coating a radiant energy exposed and imaged polyacetylenic recording film with an effective UV development inhibiting amount of the composition of claim 1.

5. The process which comprises coating a radiant energy exposed and imaged polyacetylenic recording film with an effective UV development inhibiting amount of the composition of claim 2.

6. The process which comprises coating a radiant energy exposed and imaged polyacetylenic recording film with an effective UV development inhibiting amount of the composition of claim 3.

7. The process of claim 4 wherein the coating composition is dried on the surface of said film to a thickness of between about 5 and about 30 micrometers.

8. The process of claim 4 wherein said film is coated to a thickness of 8 to 10 micrometers with a composition of one part by weight of 2,2'-dihydroxy-4-methoxy benzophenone and between about 20 and about 30 parts by weight of methyl vinyl ether/monobutyl maleate copolymer in 40-60% ethanol to provide a clear transparent film over said exposed film surface.

* * * * *